(12) United States Patent
Matsuyama

(10) Patent No.: US 11,728,144 B2
(45) Date of Patent: Aug. 15, 2023

(54) EDGE RING AND SUBSTRATE PROCESSING APPARATUS

(71) Applicant: Tokyo Electron Limited, Tokyo (JP)

(72) Inventor: Shoichiro Matsuyama, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 197 days.

(21) Appl. No.: 17/104,467

(22) Filed: Nov. 25, 2020

(65) Prior Publication Data

US 2021/0175051 A1   Jun. 10, 2021

(30) Foreign Application Priority Data

Dec. 5, 2019   (JP) .................................. 2019-220661

(51) Int. Cl.
*H01J 37/32*   (2006.01)

(52) U.S. Cl.
CPC .. *H01J 37/32642* (2013.01); *H01J 37/32724* (2013.01)

(58) Field of Classification Search
None
See application file for complete search history.

(56) References Cited

U.S. PATENT DOCUMENTS

| | | | |
|---|---|---|---|
| 2017/0066103 A1* | 3/2017 | Tomioka | ................. B24B 37/20 |
| 2021/0308812 A1* | 10/2021 | Maeda | ................ H01L 21/6831 |

FOREIGN PATENT DOCUMENTS

| | | | |
|---|---|---|---|
| JP | 2015-062237 | 4/2015 | |
| JP | 2016184645 | * 10/2016 | ........... H01L 21/683 |
| JP | 2017-050509 | 3/2017 | |
| JP | 2018-107433 | 7/2018 | |
| WO | 2019/088204 | 5/2019 | |

* cited by examiner

*Primary Examiner* — Ram N Kackar
(74) *Attorney, Agent, or Firm* — IPUSA, PLLC

(57) ABSTRACT

An edge ring that is placed on an electrostatic chuck of a substrate processing apparatus so as to surround a periphery of a substrate is provided. Multiple contact portions are provided on a lower surface of the edge ring, and each of the contact portions is of a ring shape. Each of the contact portions is in line contact with a mounting surface of the electrostatic chuck.

15 Claims, 5 Drawing Sheets

EDGE RING AND SUBSTRATE PROCESSING APPARATUS

CROSS-REFERENCE TO RELATED APPLICATIONS

This patent application is based on and claims priority to Japanese Patent Application No. 2019-220661 filed on Dec. 5, 2019, the entire contents of which are incorporated herein by reference.

TECHNICAL FIELD

The present disclosure relates to an edge ring and a substrate processing apparatus.

BACKGROUND

For example, Patent Document 1 describes a focus ring that contacts a member of a lower electrode, and a surface roughness of at least one of the contact surface of the focus ring and the contact surface of the member of the lower electrode is equal to or greater than 0.1 μm, in order to stabilize attraction characteristics of the focus ring.

RELATED ART DOCUMENT

Patent Document

[Patent Document 1] Japanese Laid-open Patent Application Publication No. 2017-050509

SUMMARY

The present disclosure provides a technique for reducing leakage of a heat transfer gas supplied between an edge ring (also referred to as a focus ring) and a mounting surface of an electrostatic chuck on which the edge ring is placed, thereby improving heat transfer characteristics.

According to one aspect of the present disclosure, an edge ring that is placed on an electrostatic chuck of a substrate processing apparatus so as to surround a periphery of a substrate is provided. Multiple contact portions are provided on a lower surface of the edge ring, and each of the contact portions is of a ring shape. Each of the contact portions is in line contact with a mounting surface of the electrostatic chuck.

DETAILED DESCRIPTION OF EMBODIMENTS

In the following, embodiments of the present disclosure will be described with reference to the drawings. Note that in the following drawings, elements having identical features are given the same reference symbols and overlapping descriptions may be omitted.

[Overall Configuration of Substrate Processing Apparatus]

Figure 1:
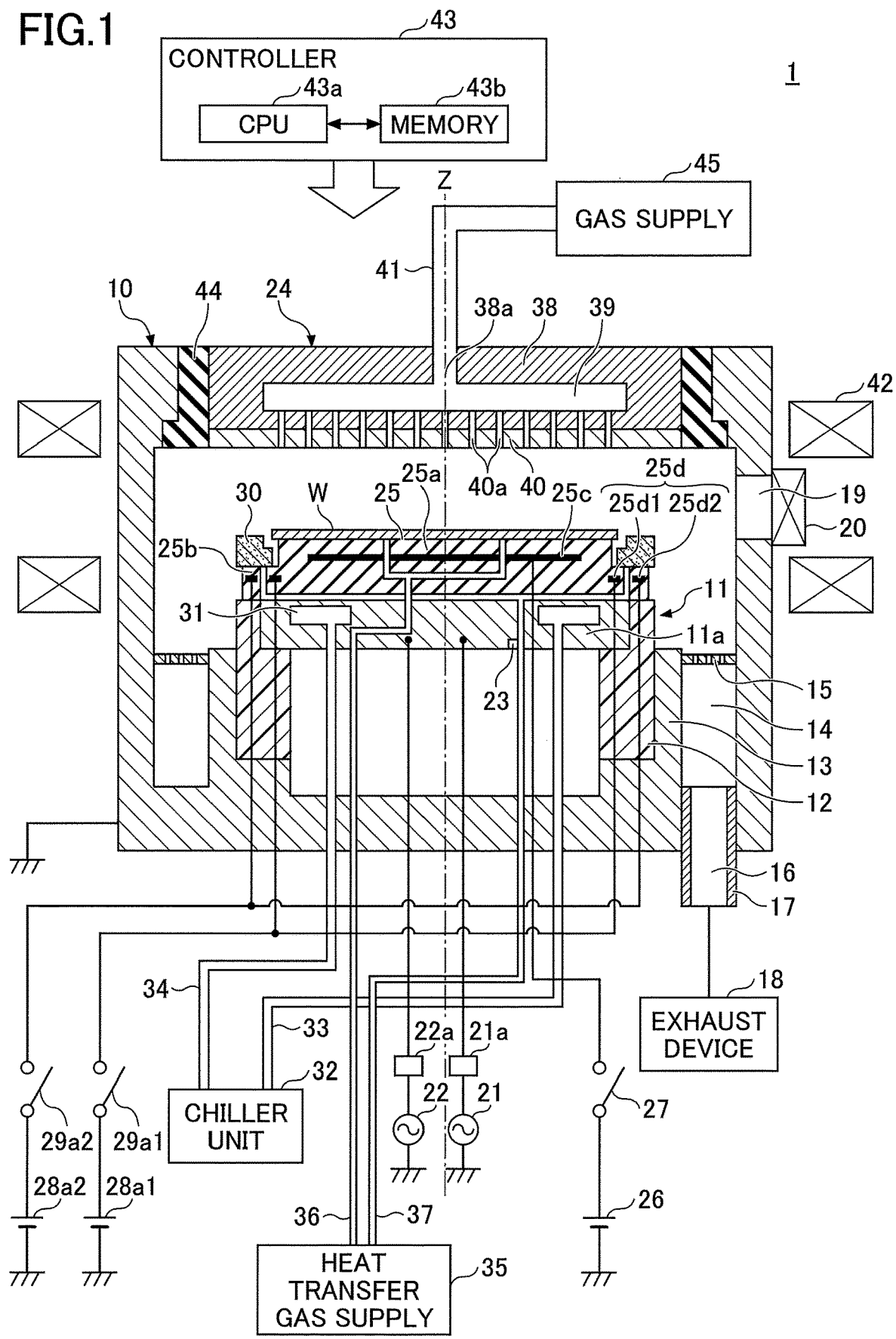
FIG. 1 is a cross-sectional view illustrating a substrate processing apparatus according to an embodiment.

FIG. 1 is a cross-sectional view illustrating a schematic configuration of a substrate processing apparatus 1 according to an embodiment. The present embodiment describes a case in which the substrate processing apparatus 1 disclosed in the present embodiment is a reactive-ion etching (RIE) type substrate processing apparatus. However, the substrate processing apparatus 1 may be a plasma etching apparatus, a plasma CVD apparatus, or the like that utilizes surface wave plasma.

The substrate processing apparatus 1 includes a cylindrical chamber 10 made of metal, such as aluminum or stainless steel. The interior of the chamber 10 is a processing chamber in which a plasma process, such as plasma etching or plasma CVD, is performed. The chamber 10 is grounded.

A disc-shaped stage 11, on which a substrate W is placed, is provided in the chamber 10. The stage 11 also functions as a lower electrode. The stage 11 includes a base 11a and an electrostatic chuck 25, and the electrostatic chuck 25 is disposed on the base 11a. The base 11a is made of aluminum for example, and is supported by a cylindrical support 13 that extends vertically upward from the bottom of the chamber 10, via an insulating cylindrical support member 12.

The electrostatic chuck 25 includes a disc-shaped central portion 25a on which the substrate W is placed, and an annular peripheral portion 25b. The height of the central portion 25a is higher than the height of the peripheral portion 25b. An edge ring 30 surrounding the periphery of the substrate W is placed on the upper surface of the peripheral portion 25b. In some cases, the height of the central portion 25a may be equal to the height of the peripheral portion 25b.

The central portion 25a is formed by sandwiching an electrode 25c made of a conductive film between a pair of dielectric films. The peripheral portion 25b is constructed by sandwiching an electrode 25d made of a conductive film between a pair of dielectric films. The electrode 25d is a bipolar type electrode structure having an inner peripheral electrode 25d1 and an outer peripheral electrode 25d2.

A power supply 26 is electrically connected to the electrode 25c via a switch 27. A power supply 28a1 is electrically connected to the electrode 25d1 via a switch 29a1. A power supply 28a2 is electrically connected to the electrode 25d2 via a switch 29a2. The electrostatic chuck 25 generates Coulomb force by voltage supplied from the power supply 26 to the electrode 25c (hereinafter, also referred to as "HV voltage"), thereby electrostatically attracting and holding the substrate W onto the electrostatic chuck 25.

The electrostatic chuck 25 generates Coulomb force by voltage supplied to the electrode 25d1 from the power supply 28a1 and voltage supplied to the electrode 25d2 from the power supply 28a2, thereby electrostatically attracting and holding the edge ring 30 onto the electrostatic chuck 25. In a bipolar type electrode, charge of different polarity can be supplied to each of the electrode 25d1 and the electrode 25d2. However, the electrode 25d may be a unipolar type electrode structure in which the electrode 25d1 and the electrode 25d2 are integrated.

Inside the base 11a, for example, an annular or spiral refrigerant chamber 31 extending circumferentially is provided. A temperature control medium at a predetermined temperature, such as cooling water, is supplied to the refrigerant chamber 31 from a chiller unit 32, and the temperature control medium circulates through the refrigerant chamber 31 and pipes 33 and 34. The temperature of the substrate W placed on the electrostatic chuck 25 is controlled by the temperature of the temperature control medium.

A heat transfer gas supply 35 supplies a heat transfer gas to a space between the central portion 25a of the electrostatic chuck 25 and the substrate W via a heat transfer gas line 36. The heat transfer gas supply 35 also supplies the heat transfer gas to a space between the peripheral portion 25b of the electrostatic chuck 25 and the edge ring 30 via a heat transfer gas line 37. As the heat transfer gas, a gas having heat conductivity, such as helium gas, may preferably be used. A pressure adjustable flow meter 23 is attached to a heat transfer gas inlet at the base 11a that is connected to the heat transfer gas line 37, and is configured to measure a flow rate of the heat transfer gas supplied to the space between the peripheral portion 25b and the edge ring 30. As attractive force for attracting the edge ring 30 to the electrostatic chuck 25 decreases and an amount of leakage of the heat transfer gas from the space between the peripheral portion 25b and the edge ring 30 increases, the flow rate of the heat transfer gas measured by the flow meter 23 increases. The flow meter 23 may be disposed at any location at which the flow rate of the heat transfer gas flowing through the heat transfer gas line 37 can be measured as the flow rate of the heat transfer gas supplied to the space between the peripheral portion 25b and the edge ring 30.

A first radio frequency power supply 21 for plasma generation is electrically connected to the stage 11 via a matcher 21a. The first radio frequency power supply 21 supplies, for example, radio frequency power at 40 MHz to the stage 11. In the present embodiment, radio frequency power supplied from the first radio frequency power supply 21 is referred to as "HF power". A second radio frequency power supply 22 for biasing is also electrically connected to the stage 11 via a matcher 22a. The second radio frequency power supply 22 supplies radio frequency power having a lower frequency than the HF power to the stage 11. In the present embodiment, radio frequency power supplied from the second radio frequency power supply 22 is referred to as "LF power". The frequency of the LF power is, for example, 3 MHz.

An exhaust path 14 is formed between the inner side wall of the chamber 10 and the outer peripheral wall of the cylindrical support 13. An annular baffle plate 15 is provided at the inlet or midway of the exhaust path 14, and an exhaust port 16 is provided at the bottom of the exhaust path 14. The exhaust port 16 is connected to an exhaust device 18 via an exhaust pipe 17. The exhaust device 18 includes a vacuum pump to reduce the pressure in a processing space in the chamber 10 to a predetermined vacuum level. In addition, the exhaust pipe 17 includes an automatic pressure control valve (APC; not illustrated in the drawing), which is a variable butterfly valve. The automatic pressure control valve automatically controls the pressure in the chamber 10.

A loading/unloading port 19 is provided at the side wall of the chamber 10, and is opened and closed by a gate valve 20 when the substrate W is loaded into or unloaded from the chamber 10. A gas showerhead 24 is attached to an upper opening of the chamber 10 via an insulating member 44, and the upper opening of the chamber 10 is occluded by the gas showerhead 24. The gas showerhead 24 also functions as an upper electrode. With such a configuration, the HF power is supplied from the first radio frequency power supply 21 to a space between the stage 11 and the gas showerhead 24.

The gas showerhead 24 has a ceiling plate 40 and an electrode support 38 that detachably supports the ceiling plate 40. The ceiling plate 40 includes a large number of gas holes 40a. Inside the electrode support 38, a buffer chamber 39 is provided, and a gas inlet 38a is connected to a through-hole that penetrates the electrode support 38 from the buffer chamber 39. Gas supplied from a gas supply 45 passes through the gas supply line 41, and is introduced into the buffer chamber 39 from the gas inlet 38a. The gas introduced into the buffer chamber 39 passes through the gas holes 40a, and is introduced into the chamber 10 from the lower surface of the gas showerhead 24.

In the present embodiment, the central axis of the stage 11 is defined as the Z-axis. The gas showerhead 24, the electrostatic chuck 25, the base 11a, and the electrode 25c are formed in a generally circular shape concentric to the Z-axis. The edge ring 30, the electrodes 25d1 and 25d2, and the cylindrical support member 12 are formed in a cylindrical or annular shape concentric to the Z-axis.

Components of the substrate processing apparatus 1 are connected to a controller 43. The controller 43 controls each of the components of the substrate processing apparatus 1. Examples of the components include the exhaust device 18, the first radio frequency power supply 21, the second radio frequency power supply 22, the switches 27, 29a1, and 29a2 for the electrostatic chuck, the power supplies 26, 28a1, and 28a2, the chiller unit 32, the heat transfer gas supply 35, and the gas supply 45.

The controller 43 includes a CPU 43a and a memory 43b, and controls desired substrate processing performed in the substrate processing apparatus 1, by the CPU 43a reading out a program and a processing recipe stored in the memory 43b and executing the program. The controller 43 also controls a process for controlling electrostatic attraction of the substrate W and the edge ring 30, a process for supplying a heat transfer gas, and the like, along with the substrate processing.

Annular or concentric magnets 42 are disposed around the chamber 10. By the magnets 42, a unidirectional horizontal magnetic field is formed in the chamber 10. A vertical radio frequency electric field is formed by radio frequency power supplied between the stage 11 and the gas showerhead 24. This causes magnetron discharge through a process gas in the chamber 10, and generates a high density plasma from the process gas near the surface of the stage 11.

When performing substrate processing in the substrate processing apparatus 1, the gate valve 20 is first opened, a substrate W is loaded into the chamber 10 through the loading/unloading port 19, and the substrate W is placed on the electrostatic chuck 25. A gas output from the gas supply 45 is introduced into the chamber 10, and the HF power and the LF power are supplied to the stage 11 from the first radio frequency power supply 21 and the second radio frequency power supply 22, respectively. Further, voltage is applied from the power supply 26 to the electrode 25c to attract the substrate W to the mounting surface of the electrostatic chuck 25, and voltage is applied from the power supplies 28a1 and 28a2 to the electrodes 25d1 and 25d2 respectively to attract the edge ring 30 to the mounting surface of the electrostatic chuck 25. A heat transfer gas is supplied into the space between the substrate W and the mounting surface of the electrostatic chuck 25 and into the space between the edge ring 30 and the mounting surface of the electrostatic chuck 25. The gas introduced from the gas showerhead 24 is formed into a plasma, and a predetermined plasma process is applied to the surface of the substrate W by means of radicals or ions in the plasma.

[Movement of Electric Charge Between Conventional Edge Ring and Electrostatic Chuck]

Figure 2A:
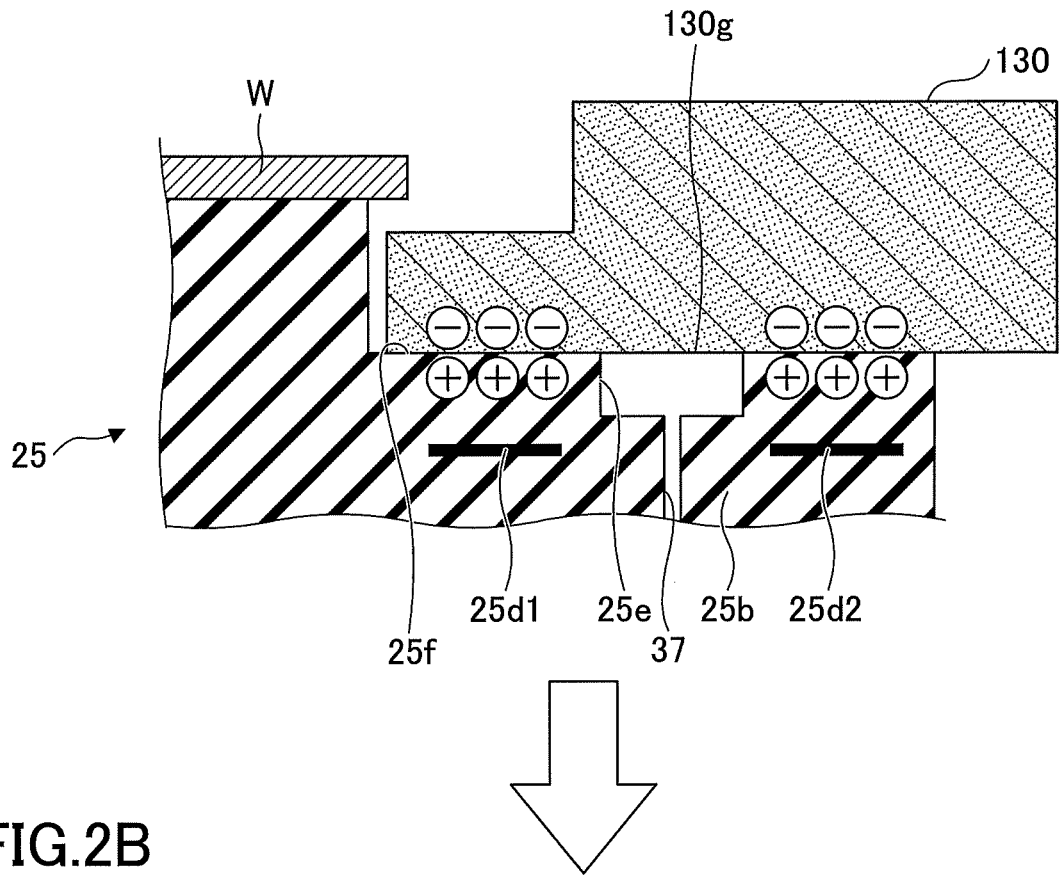
FIGS. 2A and 2B are diagrams illustrating movement of electric charge between a conventional edge ring and an electrostatic chuck.
Figure 2B:
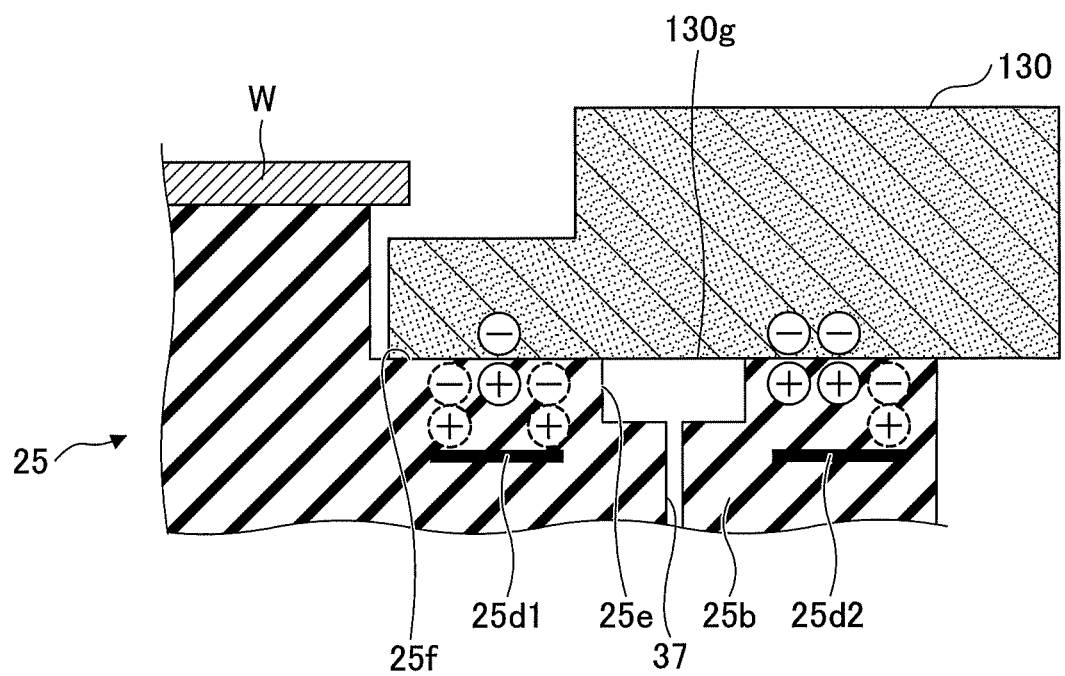

Movement of electric charge between an edge ring and an electrostatic chuck that occurs when using the conventional edge ring 130 is described with reference to FIGS. 2A and 2B. FIGS. 2A and 2B are diagrams illustrating the movement of electric charge between a conventional edge ring 130 and an electrostatic chuck 25.

The lower surface 130g of the conventional edge ring 130 is flat, and is brought into surface contact with the mounting surface 25f of the peripheral portion 25b of the electrostatic chuck 25, at portions other than a heat transfer gas supply groove 25e of the heat transfer gas line 37 provided on the electrostatic chuck 25. In such a configuration, an amount of leakage of a heat transfer gas from a space between the edge ring 130 and the mounting surface 25f of the peripheral portion 25b gradually increases. The reason will be described below.

Normally, when the HV voltage is supplied to the electrodes 25d1 and 25d2, as illustrated in FIG. 2A, Coulomb force is generated by electric charge accumulated near the lower surface 130g of the edge ring 130 and electric charge of opposite polarity accumulated in the electrodes 25d1 and 25d2. This causes the edge ring 130 to be attracted to the electrostatic chuck 25.

In this case, the lower surface 130g of the edge ring 130 is in surface contact with the mounting surface 25f of the electrostatic chuck 25. Because a contact area when the lower surface 130g is in surface contact with the mounting surface 25f is larger than a contact area between the lower surface 130g and the mounting surface 25f when the lower surface 130g is in line contact with the mounting surface 25f, electric charge is easily moved from between the edge ring 130 and the electrostatic chuck 25. Accordingly, as illustrated in FIG. 2B, as processing time of the substrate increases, the electric charge gradually moves from between the edge ring 130 and the electrostatic chuck 25 made of ceramic, thereby reducing attractive force for attracting the edge ring 130. Therefore, as processing time of the substrate increases and a period of time when the edge ring 130 is attracted to the electrostatic chuck 25 becomes longer, decrease in the attractive force for attracting the edge ring 130 becomes greater.

Occurrence of the above-described movement of electric charge from between the edge ring 130 and the electrostatic chuck 25 is not limited to the case in which the processing time of the substrate is long. The above-described movement of electric charge from between the edge ring 130 and the electrostatic chuck 25 is also likely to occur when the temperature of the edge ring 130 and the electrostatic chuck 25 is high or when magnitude of the LF power is high. In an etching process with a high aspect ratio in recent years, because time for the etching process tends to be longer, movement of electric charge occurs easily. Also, in substrate processing in recent years, magnitude of the LF power tends to be controlled to be high, to increase an amount of ions drawn to the stage 11, and in this case, movement of electric charge occurs easily. Furthermore, as the HF power tends to be supplied at high power, the temperature of the edge ring 130 tends to be high due to heat input from a plasma. This also facilitates movement of electric charge. Because of these factors, attractive force for attracting the edge ring 130 decreases, so that the heat transfer gas leaks from the space between the edge ring 130 and the mounting surface 25f of the peripheral portion 25b, and the leakage amount of the heat transfer gas gradually increases.

In areas where heat transfer leaks, the pressure decreases, and the temperature of the edge ring 130 becomes locally high. Thus, controllability of the temperature of the edge ring 130 deteriorates. As a result, temperature distribution becomes non-uniform in the circumferential direction of the substrate W, and this exerts an adverse effect on the substrate processing.

Accordingly, in order to suppress movement of electric charge from between the edge ring 30 and the electrostatic chuck 25, the edge ring 30 according to the present embodiment is configured such that the lower surface of the edge ring 30 is brought into line contact with the mounting surface of the electrostatic chuck 25 rather than surface contact. This allows the edge ring 30 to be stably attracted to the electrostatic chuck 25 even in substrate processing with a high aspect ratio or substrate processing using the high LF power.

<Edge Ring According to the Present Embodiment>

Figure 3A:
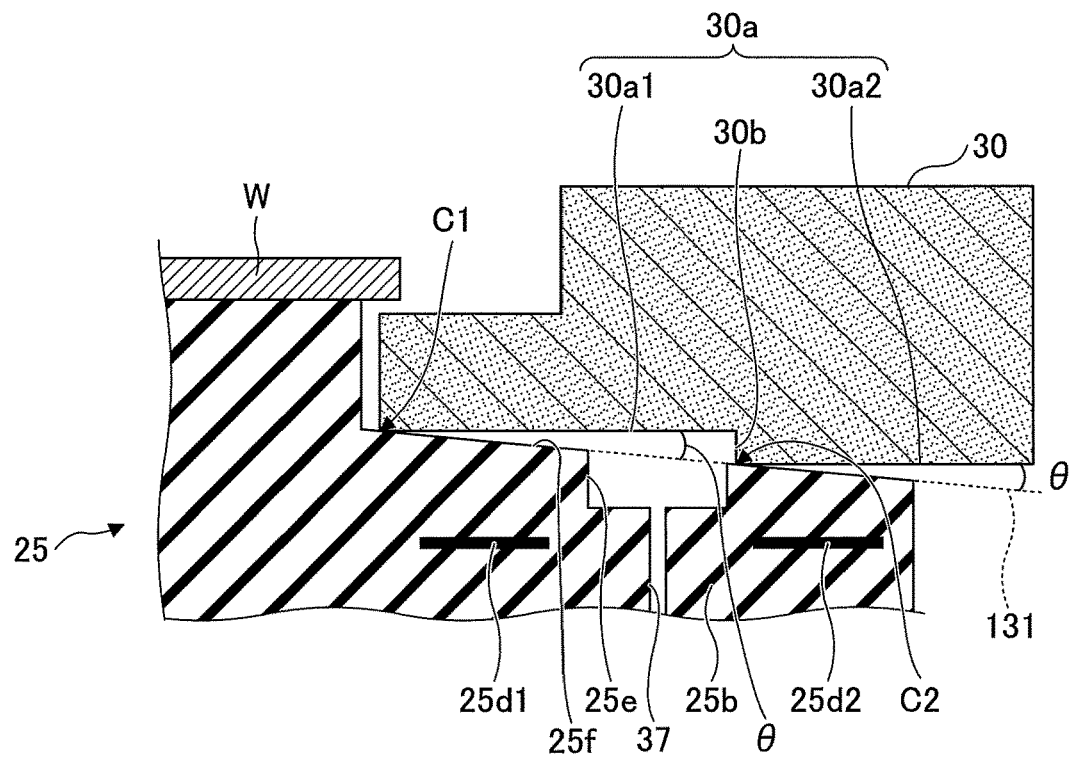
FIG. 3A is a diagram illustrating the configuration of an edge ring according to the embodiment.

Hereinafter, the configuration of the edge ring 30 according to the present embodiment will be described with reference to FIG. 3A. FIG. 3A is a diagram illustrating the configuration of the edge ring 30 according to the present embodiment. The lower surface 30a of the edge ring 30 according to the present embodiment is provided with a contact portion C1 and a contact portion C2 that contact the mounting surface 25f of the electrostatic chuck 25. Each of the contact portion C1 and the contact portion C2 contacts the mounting surface 25f by ring-shaped line contact.

The lower surface 30a of the edge ring 30 includes a lower surface 30a1 and a lower surface 30a2, each of which is formed horizontally. The lower surface 30a2 is located below the lower surface 30a1. At the center of the lower surface 30a, which is between the lower surface 30a1 and the lower surface 30a2, a vertical section 30b is formed. In the following description, the vertical section 30b may also be referred to as a "riser 30b".

The lower surface of the edge ring 30 is processed to form steps (i.e., lower surfaces 30a1 and 30a2). The edge ring 30 before being processed has an inclined surface 131 at its bottom. The inclined surface 131 of the lower surface 30a, to which the steps are formed, is inclined downward toward the outer periphery of the edge ring 30 at a tilt angle θ with respect to the horizontal plane. For example, the tilt angle θ is approximately within a range from 0.03° to 0.06° downward with respect to the horizontal direction. In the present embodiment, the horizontal lower surfaces 30a1 and 30a2 are formed by processing the inclined surface 131. However, a method of forming the lower surfaces 30a1 and 30a2 is not limited thereto. By processing the lower surface 30a of the edge ring 30 as described above, the lower surface 30a is formed into steps lowering toward the outer periphery. The height of the riser 30b may be approximately 15 μm to 30 μm.

The contact portion C1 is formed into a ring shape, at an inner edge of the lower surface 30a1 arranged at the inner side of the lower surface 30a of the edge ring 30, and the contact portion C2 is formed into a ring shape, at an inner edge of the lower surface 30a2 arranged at the outer side of the lower surface 30a of the edge ring 30. The contact portion C1 and the contact portion C2 are concentrically formed with respect to the Z-axis (see FIG. 1), which is the central axis. Multiple heat transfer gas supply grooves 25e are formed in the mounting surface 25f. In addition, supply channels as paths for a heat transfer gas may be formed. The contact portion C1 and the contact portion C2 are configured to contact the mounting surface 25f by ring-shaped line contact, while avoiding the contact portions C1 and C2 being disposed at the heat transfer gas supply grooves 25e or the supply channels as possible. If part of the contact portion C1 or the contact portion C2 is located at the heat transfer gas supply grooves 25e or the supply channels, the ring-shaped line contact is partially interrupted. However, the ring-shaped line contact of the contact portion C1 and of the contact portion C2 may include a case in which the line contact of the contact portion C1 or of the contact portion C2 is partly interrupted. Line contact of the contact portion C1 and the contact portion C2 has a width on the order of micrometers (μm) (e.g., a single digit number of micrometers). That is, the contact portion C1 and the contact portion C2 are brought into line contact with the mounting surface 25f at a width on the order of μm.

The contact portion C1 may be disposed inward relative to the heat transfer gas supply grooves 25e in the radial direction, and the contact portion C2 may be disposed outward relative to the heat transfer gas supply grooves 25e in the radial direction. The contact portion C2 is located below the contact portion C1. The contact portions C1 and C2 are edges provided on the lower surface 30a of the edge ring 30. The contact portion C1 is an example of a first contact portion. The contact portion C2 is an example of a second contact portion.

Thus, the edge ring 30 is in ring-shaped line contact with the electrostatic chuck 25, and has a smaller contact area than the conventional edge ring 130 that is in surface contact with the electrostatic chuck 25. Thus, electric charge does not move substantially from between the edge ring 30 and the electrostatic chuck 25 made of ceramic. As described above, in the edge ring 30 according to the present embodiment, the attractive force for attracting the electrostatic chuck 25 of the edge ring 30 does not decrease even if attracting time is increased. Accordingly, leakage of the heat transfer gas supplied between the edge ring 30 and the electrostatic chuck 25 is suppressed, and stable and good heat transfer characteristics can be obtained. Accordingly, because heat can be stably removed from the edge ring 30, controllability of the temperature of the edge ring 30 can be improved. That is, locally high temperature portions are not formed in the edge ring 30, and radical supply distribution can be uniform in the circumferential direction of the substrate W. As a result, uniformity of substrate processing can be increased.

[Experimental Results]

Figure 4:
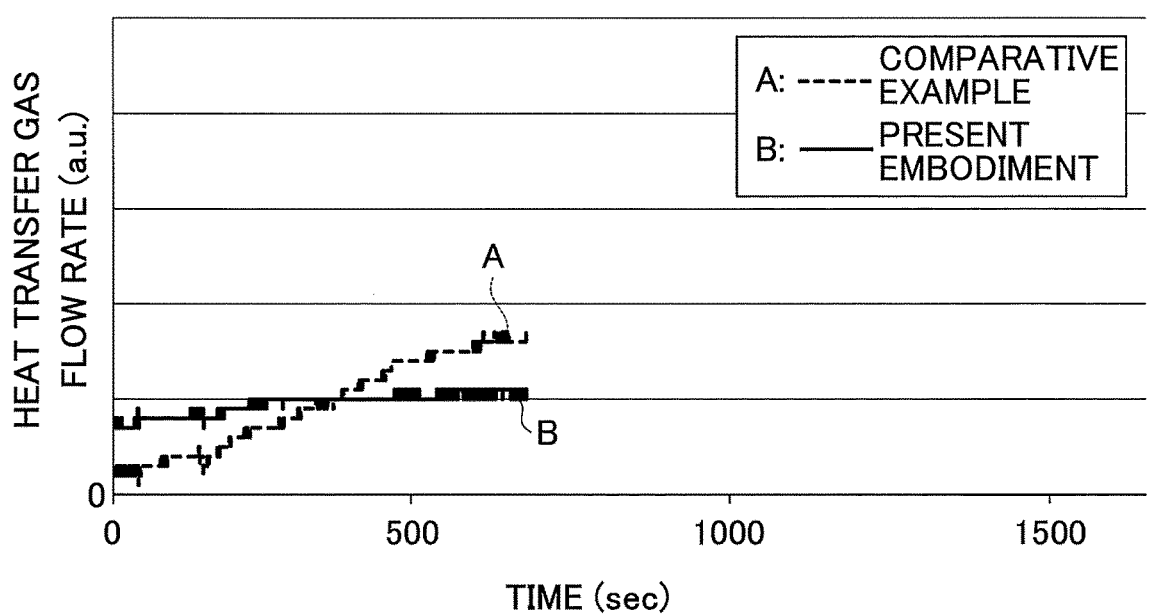
FIG. 4 is a graph illustrating experimental results of measuring flow rates of a heat transfer gas when the edge ring according to the embodiment was used and when the edge ring according to a comparative example was used.

Next, measurement results of the flow rate of the heat transfer gas when the heat transfer gas was supplied from the heat transfer gas line 37 during processing of the substrate using the substrate processing apparatus 1 illustrated in FIG. 1 will be described with reference to FIG. 4. FIG. 4 is a graph illustrating experimental results of measuring flow rates of the heat transfer gas when the edge ring 30 according to the present embodiment was used and when the edge ring 130 according to a comparative example was used. The edge ring 30 according to the present embodiment has the structure of the edge ring 30 illustrated in FIG. 3A, and the edge ring 130 according to the comparative example has the structure of the conventional edge ring 130 illustrated in FIG. 2A or 2B.

The horizontal axis of FIG. 4 indicates time (s), and the vertical axis indicates a measured value of the flow rate of the heat transfer gas (a.u.). The measured value of the flow rate of the heat transfer gas was obtained from the flow meter (see FIG. 1) by measuring the flow rate of the heat transfer gas flowing through the heat transfer gas line 37.

As a result of the experiments, in a case in which the edge ring 130 according to the comparative example was used, the measured value of the flow rate of the heat transfer gas increased over time. This is because the lower surface 130g of the edge ring 130 is in surface contact with the mounting surface 25f, so that electric charge moves from between the edge ring 130 and the electrostatic chuck 25, and attractive force for attracting the edge ring 130 decreases over time. Therefore, the amount of leakage of the heat transfer gas from the space between the lower surface 130g of the edge ring 130 and the mounting surface 25f increased.

In contrast, in the edge ring 30 according to the present embodiment, the measured value of the flow rate of the heat transfer gas was generally constant even after a lapse of time. This is because the lower surface 30a of the edge ring 30 is in line contact with the mounting surface 25f. Thus, electrical charge does not move from between the edge ring 30 and the electrostatic chuck 25, and the attractive force for attracting the edge ring 30 does not change over time. Therefore, the amount of leakage of the heat transfer gas from the space between the lower surface 30a of the edge ring 30 and the mounting surface 25f was constant.

From the above-described results, in the edge ring 30 according to the embodiment, as the leakage amount of the heat transfer gas generally does not change, heat removal of the edge ring 30 can be performed stably, and controllability of the temperature of the edge ring 30 can be improved. As a result, uniformity of the substrate processing can be improved.

<Variations>

(First Variation)

Figure 3B:
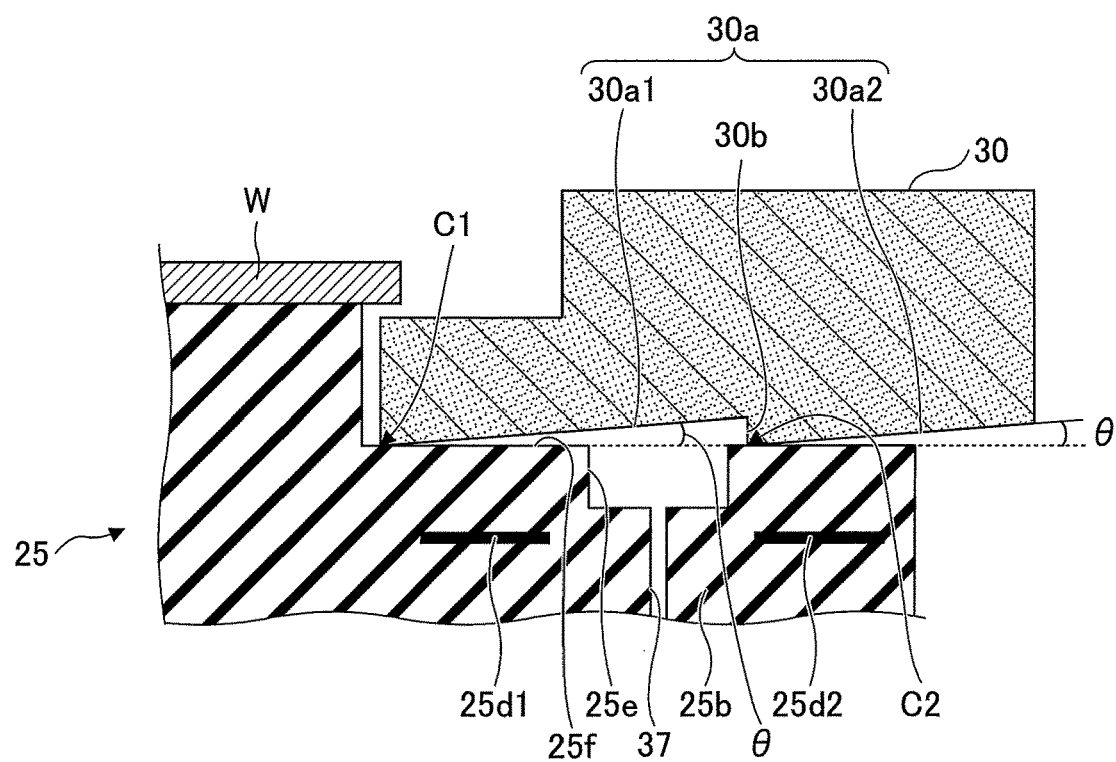
FIG. 3B is a diagram illustrating the configuration of an edge ring according to a first variation of the embodiment.

Next, the configuration of the edge ring 30 according to a first variation of the present embodiment will be described with reference to FIG. 3B. FIG. 3B illustrates the configuration of the edge ring 30 according to the first variation of the present embodiment.

The lower surface 30a of the edge ring 30 according to the first variation includes a contact portion C1 and a contact portion C2 that contact the mounting surface 25f of the electrostatic chuck 25. Each of the contact portion C1 and the contact portion C2 is brought into ring-shaped line contact with the mounting surface 25f.

The lower surface 30a of the edge ring 30 is formed to a shape of a sawtooth wave in the cross-sectional view. The lower surface 30a of the edge ring 30 includes a lower surface 30a1 and a lower surface 30a2, each of which is inclined upward toward the outer periphery of the edge ring 30. At the center of the lower surface 30a, which is between the lower surface 30a1 and the lower surface 30a2, a vertical section 30b is formed. The lower surface 30a1 is located inward relative to the vertical section 30b in the radial direction, and the lower surface 30a2 is located outward relative to the vertical section 30b in the radial direction. The tilt angle θ of the lower surface 30a1 may be the same as the tilt angle θ of the lower surface 30a2, or may be different. For example, the tilt angle θ is approximately within a range between 0.03° and 0.06° upward with respect to the horizontal direction. By processing a horizontal plane, the lower surfaces 30a1 and 30a2, each of which is an inclined surface with the tilt angle θ, are formed.

The contact portion C1 is formed into a ring shape, at an inner edge of the lower surface 30a1 arranged at the inner side of the lower surface 30a of the edge ring 30, and the contact portion C2 is formed into a ring shape, at an inner edge of the lower surface 30a2 arranged at the outer side of the lower surface 30a of the edge ring 30. The contact portion C1 and the contact portion C2 are brought into ring-shaped line contact with the mounting surface 25f. The contact portion C1 and the contact portion C2 are brought into line contact with the mounting surface 25f at a width on the order of micrometers. The contact portion C1 may be disposed inward relative to the heat transfer gas supply grooves 25e in the radial direction, and the contact portion C2 may be disposed outside relative to the heat transfer gas supply grooves 25e in the radial direction. The contact portion C2 is located at the same level as the contact portion C1. The contact portions C1 and C2 are edges provided on the lower surface 30a of the edge ring 30.

The edge ring 30 according to the first variation can also suppress leakage of the heat transfer gas supplied between the edge ring 30 and the mounting surface 25f of the electrostatic chuck 25, and can improve heat transfer characteristics.

Figure 5A:
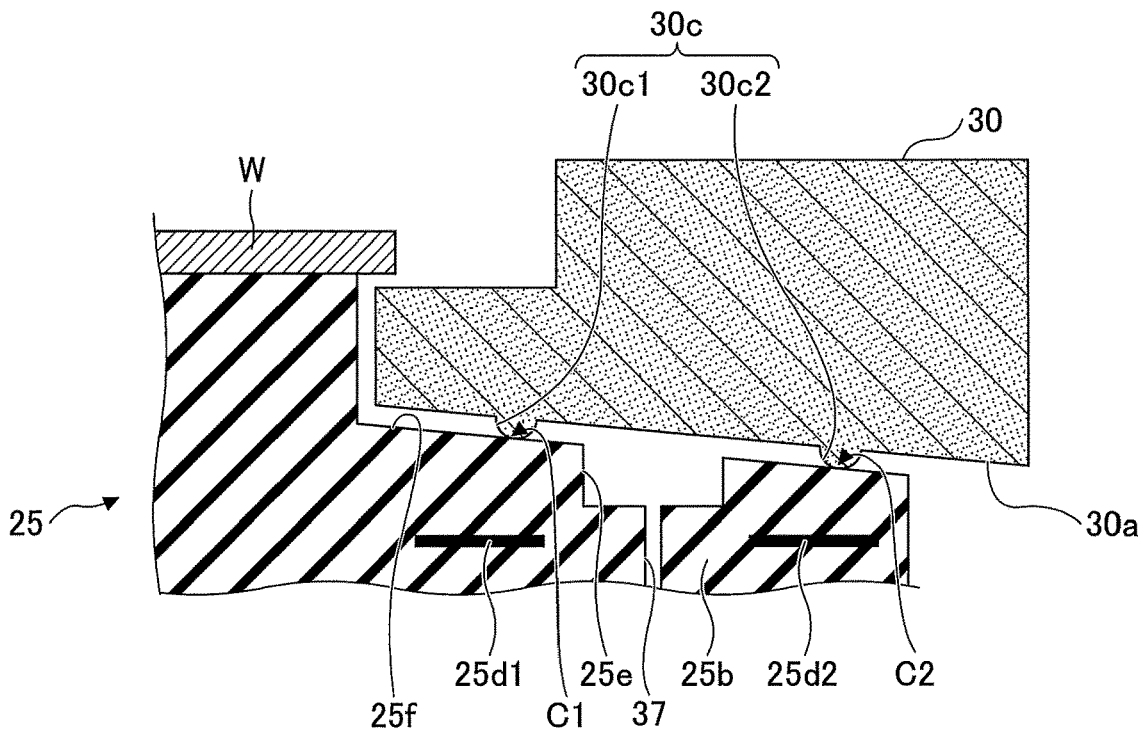
FIG. 5A illustrates the configuration of an edge ring according to a second variation of the embodiment.
Figure 5B:
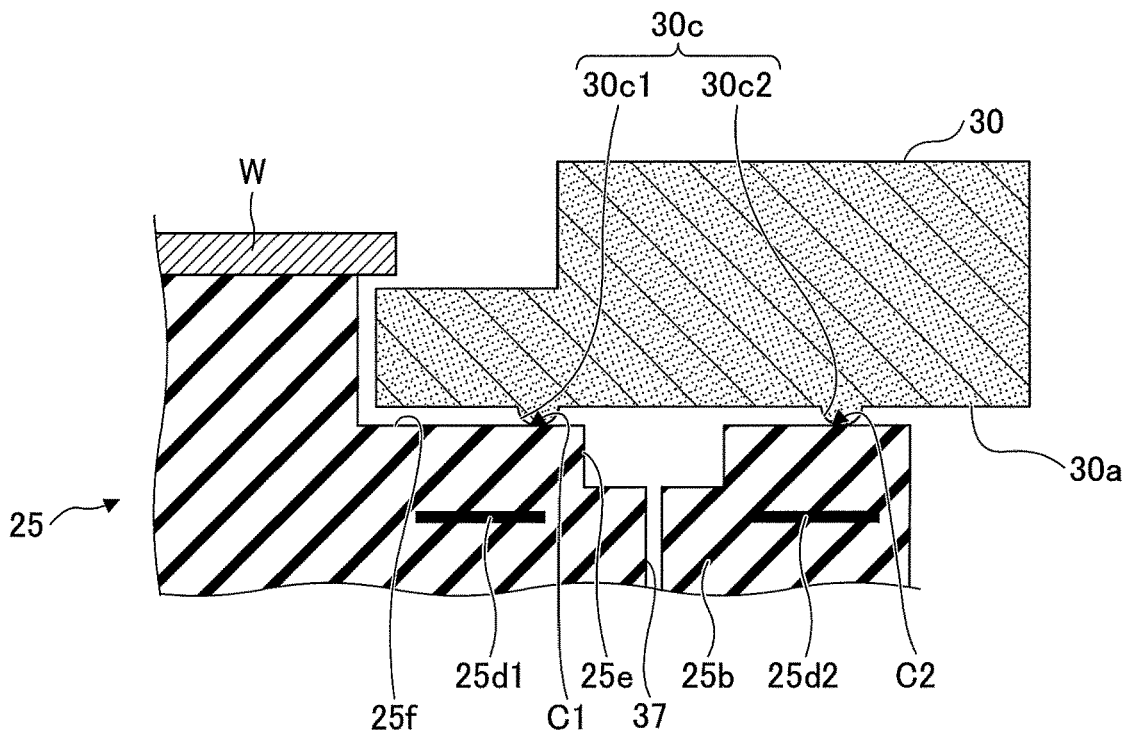
FIG. 5B illustrates the configuration of an edge ring according to a third variation of the embodiment.

Next, the configuration of the edge ring 30 according to second and third variations of the present embodiment will be described with reference to FIGS. 5A and 5B. FIG. 5A illustrates the configuration of the edge ring 30 according to the second variation of the present embodiment. FIG. 5B illustrates the configuration of the edge ring 30 according to the third variation of the present embodiment.

(Second Variation)

The lower surface 30a of the edge ring 30 according to the second variation illustrated in FIG. 5A includes a contact portion C1 and a contact portion C2 that contact the mounting surface 25f of the electrostatic chuck 25. The contact portion C1 and the contact portion C2 are brought into ring-shaped line contact with the mounting surface 25f.

The lower surface 30a of the edge ring 30 is formed as a slope descending toward the outer periphery of the edge ring 30, and includes a protrusion 30c. The tilt angle θ of the lower surface 30a of the edge ring 30 with respect to the horizontal plane is approximately within a range from 0.03° to 0.06° downward with respect to the horizontal direction.

The protrusion 30c, which is constituted by multiple protrusions, includes an inward protrusion 30c1 having a semicircular cross section, and an outward protrusion 30c2 having a semicircular cross section. The protrusions 30c1 and 30c2 are concentrically formed in the circumferential direction, with respect to the central axis Z of the substrate processing apparatus 1 (see FIG. 1).

Accordingly, the contact portion C1 of the second variation is the protrusion 30c1, and is brought into ring-shaped line contact with the mounting surface 25f at a tip of the protrusion 30c1. Also, the contact portion C2 of the second variation is the protrusion 30c2, and is brought into ring-shaped line contact with the mounting surface 25f at a tip of the protrusion 30c2. The contact portion C1 and the contact portion C2 are brought into line contact with the mounting surface 25f at a width on the order of μm. The contact portion C1 may be disposed inward relative to the heat transfer gas supply grooves 25e in the radial direction, and the contact portion C2 may be disposed outward relative to the heat transfer gas supply grooves 25e in the radial direction. The contact portion C2 is located below the contact portion C1. The contact portions C1 and C2 are protrusions provided on the lower surface 30a of the edge ring 30.

(Third Variation)

The lower surface 30a of the edge ring 30 according to the third variation illustrated in FIG. 5B has a contact portion C1 and a contact portion C2 that contact the mounting surface 25f of the electrostatic chuck 25. The contact portion C1 and the contact portion C2 are brought into ring-shaped line contact with the mounting surface 25f of the electrostatic chuck 25.

The lower surface 30a of the edge ring 30 is horizontal toward the outer periphery of the edge ring 30, and has a protrusion 30c. The protrusion 30c, which is constituted by multiple protrusions, includes an inward protrusion 30c1 having a semicircular cross section, and an outward protrusion 30c2 having a semicircular cross section. The protrusions 30c1 and 30c2 are concentrically formed in a circumferential direction, with respect to the central axis Z of the substrate processing apparatus 1 (see FIG. 1).

Accordingly, the contact portion C1 of the third variation is the protrusion 30c1, and is brought into ring-shaped line contact with the mounting surface 25f at a tip of the protrusion 30c1. Also, the contact portion C2 of the third variation is the protrusion 30c2, and is brought into ring-shaped line contact with the mounting surface 25f at a tip of the protrusion 30c2. The contact portion C1 and the contact portion C2 are brought into line contact with the mounting surface 25f at a width on the order of micrometers. The contact portion C1 may be disposed inward relative to the heat transfer gas supply grooves 25e in the radial direction, and the contact portion C2 may be disposed outward relative to the heat transfer gas supply grooves 25e in the radial direction. The contact portion C2 is located at the same height as the contact portion C1. The contact portions C1 and C2 are protrusions provided on the lower surface 30a of the edge ring 30.

A cross-sectional shape of the protrusion 30c according to the second or third variation is not limited to a semicircle. Any shape can be employed for the shape of the protrusion 30c, as long as the protrusion 30c is in line contact with the electrostatic chuck 25. For example, the cross section of the protrusion 30c may be a triangle, or may be of other shapes such as polygons.

As described above, because the edge ring 30 according to the present embodiment and the first to third variations is in ring-shaped line contact with the electrostatic chuck 25, the edge ring 30 has a smaller contact area than the conventional edge ring 130 that is in surface contact with the electrostatic chuck 25. Thus, even if processing time of a substrate increases, movement of electric charge from between the edge ring 30 and the electrostatic chuck 25 is less likely to occur. Therefore, attractive force for attracting the edge ring 30 does not decrease. This prevents a heat transfer gas from being leaked from the space between the edge ring 30 and the electrostatic chuck 25, thereby improving heat transfer characteristics.

Further, in the edge ring 30 according to the present embodiment and the first to third variations, the number of contact portions that are brought into line contact with the electrostatic chuck 25 is not limited to two, and multiple contact portions may be provided in the edge ring 30. The number of contact portions may be three or more.

The edge ring and the substrate processing apparatus according to the embodiment and its variations that have been disclosed herein should be considered exemplary in all respects and not restrictive. The above embodiment and its variations may be modified and enhanced in various forms without departing from the appended claims and spirit thereof. Matters described in the above embodiment and its variations may take other configurations to an extent not inconsistent, and may be combined to an extent not inconsistent.

The substrate processing apparatus of the present disclosure is applicable to any of the following types of processing apparatuses: an atomic layer deposition (ALD) type processing apparatus, a capacitively coupled plasma (CCP) type processing apparatus, an inductively coupled plasma (ICP) type processing apparatus, a processing apparatus using a radial line slot antenna (RLSA), an electron cyclotron resonance plasma (ECR) type processing apparatus, and a helicon wave plasma (HWP) type processing apparatus.

The substrate processing apparatus is not limited to an etching apparatus in which an etching process is applied to a substrate. The substrate processing apparatus may be a deposition apparatus in which a film forming process is applied, an asking apparatus, a cleaning apparatus, or the like.

What is claimed is:

1. An edge ring placed on an electrostatic chuck of a substrate processing apparatus so as to surround a periphery of a substrate, the edge ring formed from an upper ring surface, an inner side surface, an outer side surface and two lower planar surfaces joined by a vertical surface includes;
   a first lower surface that is concentric to the edge ring; and
   a second lower surface that is concentric to the edge ring and provided on an outer periphery side of the first lower surface;
   wherein the first lower surface is provided on a plane that is different from a plane on which the second lower surface is provided, and
   the first lower surface has a first inner periphery and the second lower surface has a second inner periphery, each of the first inner periphery and the second inner periphery being in line contact with a mounting surface of the electrostatic chuck in a ring shape.

2. The edge ring according to claim 1, wherein the second lower surface is located below the first lower surface contact portion.

3. The edge ring according to claim 2, wherein
   a heat transfer gas supply groove is provided on the electrostatic chuck;
   the first inner periphery is disposed inward relative to the heat transfer gas supply groove in a radial direction; and
   the second inner periphery is disposed outward relative to the heat transfer gas supply groove in the radial direction.

4. The edge ring according to claim 2, wherein the first lower surface and the second lower surface are formed to have steps descending toward an outer periphery of the edge ring.

5. The edge ring according to claim 4, wherein the first lower surface and the second lower surface are horizontally formed.

6. The edge ring according to claim 2, wherein each of the first lower surface and the second lower surface is formed to have a slope descending toward an outer periphery of the edge ring.

7. The edge ring according to claim 2, wherein each of the first inner periphery and the second inner periphery is in line contact with the mounting surface of the electrostatic chuck at a width on an order of micrometers.

8. The edge ring according to claim 7, wherein
   a heat transfer gas supply groove is provided on the electrostatic chuck;
   the first inner periphery is disposed inward relative to the heat transfer gas supply groove in a radial direction; and
   the second inner periphery is disposed outward relative to the heat transfer gas supply groove in the radial direction.

9. The edge ring according to claim 1, wherein the second inner periphery and the first inner periphery of are located at a same level.

10. The edge ring according to claim 1, wherein the first lower surface and the second lower surface are formed to have steps descending toward an outer periphery of the edge ring.

11. The edge ring according to claim 1, wherein the first lower surface and the second lower surface are horizontally formed.

12. The edge ring according to claim 1, wherein each of the first lower surface and the second lower surface of the edge ring is formed to have a slope descending toward an outer periphery of the edge ring.

13. The edge ring according to claim 1, wherein each of the first inner periphery and the second inner periphery is in line contact with the mounting surface of the electrostatic chuck at a width on an order of micrometers.

14. The edge ring according to claim 1, wherein the first lower surface and the second lower surface of the edge ring form a shape of a sawtooth wave in a cross-sectional view.

15. A substrate processing apparatus comprising:
   a chamber; an electrostatic chuck provided in the chamber;
   an edge ring that is placed on the electrostatic chuck so as to surround a periphery of a substrate, wherein the edge ring is formed from an upper ring surface, an inner side surface, an outer side surface and two lower planar surfaces joined by a vertical surface includes:
   a first lower surface that is concentric to the edge ring; and
   a second lower surface that is concentric to the edge ring and provided on an outer periphery side of the first lower surface, and
   wherein the first lower surface is provided on a plane that is different from a plane on which the second lower surface is provided; and
   the first lower surface has a first inner periphery and the second lower surface has a second inner periphery, each of the first inner periphery and the second inner periphery being in line contact with a mounting surface of the electrostatic chuck in a ring shape.

* * * * *